(12) United States Patent
Wilson et al.

(10) Patent No.: US 10,901,110 B2
(45) Date of Patent: Jan. 26, 2021

(54) THROUGH-CASING FIBER OPTIC MAGNETIC INDUCTION SYSTEM FOR FORMATION MONITORING

(71) Applicant: Halliburton Energy Services, Inc., Houston, TX (US)

(72) Inventors: Glenn Andrew Wilson, Singapore (SG); Ahmed Elsayed Fouda, Houston, TX (US); Burkay Donderici, Houston, TX (US); Tasneem A. Mandviwala, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 270 days.

(21) Appl. No.: 15/531,536

(22) PCT Filed: Dec. 30, 2014

(86) PCT No.: PCT/US2014/072844
§ 371 (c)(1),
(2) Date: May 30, 2017

(87) PCT Pub. No.: WO2016/108861
PCT Pub. Date: Jul. 7, 2016

(65) Prior Publication Data
US 2017/0336525 A1 Nov. 23, 2017

(51) Int. Cl.
*G01V 3/28* (2006.01)
*G01R 33/032* (2006.01)
(52) U.S. Cl.
CPC ............. *G01V 3/28* (2013.01); *G01R 33/032* (2013.01)
(58) Field of Classification Search
CPC .......... G01V 3/28; G01V 3/34; G01R 33/032; E21B 47/123; E21B 43/16; E21B 43/25;
(Continued)

(56) References Cited

U.S. PATENT DOCUMENTS 6,393,363 B1  5/2002  Wilt et al.
6,534,986 B2  3/2003  Nichols
(Continued)

FOREIGN PATENT DOCUMENTS

WO    2015/130298    9/2015
WO    2015/160347    10/2015
(Continued)

OTHER PUBLICATIONS

International Search Report and Written Opinion for PCT Patent Application No. PCT/US2014/072844, dated Sep. 25, 2015; 18 pages.
International Preliminary Report on Patentability for PCT Patent Application No. PCT/US2014/072844, dated Jul. 13, 2017; 14 pages.
(Continued)

*Primary Examiner* — Douglas X Rodriguez
*Assistant Examiner* — Brent J Andrews
(74) *Attorney, Agent, or Firm* — Thomas Rooney; Baker Botts L.L.P.

(57) ABSTRACT

A through-casing formation monitoring system may include a casing string positioned within a wellbore, a power source electrically coupled to a first transmitter configured to produce a magnetic field, a magnetic induction sensor positioned within the casing string such that the magnetic induction sensor allows a continued operation of the wellbore, a fiber optic cable coupled to an electro-optical transducer within the magnetic induction sensor, and an optical interrogation system configured to receive measurements from the magnetic induction sensor via the fiber optic cable.

23 Claims, 7 Drawing Sheets

(58) Field of Classification Search
CPC ...... E21B 43/26; E21B 23/03; E21B 33/1275; E21B 37/06; E21B 41/0035; E21B 41/02; E21B 43/12; E21B 43/122; E21B 43/123; E21B 47/00; E21B 47/011

See application file for complete search history.

(56) References Cited

U.S. PATENT DOCUMENTS

| | | | |
|---|---|---|---|
| 6,541,975 | B2 | 4/2003 | Strack |
| 8,332,191 | B2 | 12/2012 | Rosthal et al. |
| 8,400,159 | B2 | 3/2013 | Gao |
| 8,614,578 | B2 | 12/2013 | Gao et al. |
| 8,812,237 | B2 | 8/2014 | Wilt et al. |
| 9,091,785 | B2 | 7/2015 | Donderici et al. |
| 2003/0226662 | A1* | 12/2003 | Linyaev ............ E21B 47/011 166/250.11 |
| 2005/0046589 | A1 | 3/2005 | Wisler et al. |
| 2006/0272809 | A1 | 12/2006 | Tubel et al. |
| 2007/0256830 | A1* | 11/2007 | Entov ............ E21B 43/26 166/250.1 |
| 2008/0018334 | A1 | 1/2008 | Reiderman |
| 2009/0091328 | A1* | 4/2009 | Clark ............ G01V 3/28 324/338 |
| 2009/0150124 | A1 | 6/2009 | Wilt et al. |
| 2010/0271030 | A1 | 10/2010 | Reiderman et al. |
| 2011/0139447 | A1 | 6/2011 | Ramos et al. |
| 2011/0198078 | A1 | 8/2011 | Harrigan et al. |
| 2013/0056197 | A1* | 3/2013 | Maida ............ E21B 47/123 166/250.01 |
| 2014/0013554 | A1* | 1/2014 | Hojaji ............ C09D 7/61 27/1 |
| 2014/0191120 | A1 | 7/2014 | Donderici et al. |
| 2014/0222343 | A1 | 8/2014 | Samson et al. |

FOREIGN PATENT DOCUMENTS

| | | |
|---|---|---|
| WO | 2016/108845 | 7/2016 |
| WO | 2016/108861 | 7/2016 |
| WO | 2017/105467 | 6/2017 |

OTHER PUBLICATIONS

Kaufman, Alexander A. "The electrical field in a borehole with a casing." Geophysics 55.1 (1990): 29-38; 10 pages.

Schenkel, Clifford J., and H. Frank Morrison. "Electrical resistivity measurement through metal casing." Geophysics 59.7 (1994): 1072-1082; 11 pages.

Wilt, M. J., et al. "Crosswell electromagnetic tomography: System design considerations and field results." Geophysics 60.3 (1995): 871-885; 15 pages.

Alumbaugh, David L., and H. F. Morrison. "Monitoring subsurface changes over time with cross-well electromagnetic tomography." Geophysical Prospecting 43.7 (1995): 873-902; 30 pages.

Singer, Bension Sh, and Kurt-M. Strack. "New aspects of through-casing resistivity theory." Geophysics 63.1 (1998): 52-63; 12 pages.

Starcher, Mark, et al. "Next Generation Waterflood Surveillance: Behind Casing Resistivity Measurement Successfully Applied in the 'A3-A6' Waterflood at Elk Hills Field, Kern County, California." SPE Western Regional/AAPG Pacific Section Joint Meeting. Society of Petroleum Engineers, 2002; 8 pages.

Marsala, Alberto Francesco, et al. "Crosswell electromagnetic tomography: From resistivity mapping to interwell fluid distribution." International Petroleum Technology Conference. International Petroleum Technology Conference, 2008; 6 pages.

Pardo, David, Carlos Torres-Verdín, and Maciej Paszynski. "Simulations of 3D DC borehole resistivity measurements with a goal-oriented hp finite-element method. Part II: through-casing resistivity instruments." Computational Geosciences 12.1 (2008): 83-89; 7 pages.

V.E. Tsoy, N.I. Rykhlinsky, et al. "Method of Nano-Electrical Logging in Cased Wells for Evaluation of Unrecovered Oil Reserves and Determination of Oil Saturation Factor of Rocks." Methodological Maintenance of Scientific Research, 2009; 11 pages.

International Search Report and Written Opinion for PCT Patent Application No. PCT/US2014/072760, dated Sep. 9, 2015; 16 pages.

International Preliminary Report on Patentability for PCT Patent Application No. PCT/US2014/072760, dated Jul. 13, 2017; 13 pages.

\* cited by examiner

THROUGH-CASING FIBER OPTIC MAGNETIC INDUCTION SYSTEM FOR FORMATION MONITORING

RELATED APPLICATIONS

This application is a U.S. National Stage Application of International Application No. PCT/US2014/072844 filed Dec. 30, 2014, which designates the United States, and which is incorporated herein by reference in its entirety.

TECHNICAL FIELD

The present disclosure relates generally to hydrocarbon recovery operations and, more particularly, to a system and method for formation monitoring with magnetic induction sensors.

BACKGROUND

Hydrocarbons, such as oil and gas, and water may be produced from subterranean reservoir formations located onshore or offshore. The processes involved in recovering hydrocarbons from a reservoir are becoming increasingly complex. Production may involve a number of different steps such as drilling a wellbore at a desired well site, optimizing placement of the wellbore within the reservoir, treating the wellbore to optimize production of hydrocarbons, and performing the necessary steps to produce, process and transport the hydrocarbons from the reservoir.

When performing subterranean operations, it may be desirable to monitor changes in the formation and fluids located near the wellbore. For example, fluid saturations of a formation may change over time, and water produced from the wellbore may affect the economics of the well.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

The present disclosure describes a through-casing electromagnetic (EM) formation monitoring system and method for long-term monitoring of the formation surrounding a wellbore from within a casing string. The formation monitoring system includes one or more magnetic induction sensors located inside the casing string of a wellbore. The sensors measure magnetic induction, magnetic fields, or other properties along various points of the casing string and communicate those measurements to an optical interrogation system that determines formation properties (e.g., resistivity and fluid saturations of the formation) based on the measurements. Locating the magnetic induction formation monitoring system inside the casing string allows the system to be deployed into existing cased wellbores such that the formation monitoring system may be deployed in mature fields. Additionally, maintenance costs of the formation monitoring system may be reduced because the equipment is accessible and/or removable from the interior of the casing string. Further, deploying a formation monitoring system consistent with this disclosure does not interfere with the operation of the well so continuous formation monitoring is possible, even while the well continues to operate. A system and method may be designed in accordance with the teachings of the present disclosure to deploy a low-cost, long-term EM formation monitoring system within the casing string of a wellbore. Embodiments of the present disclosure and its advantages are best understood by referring to FIGS. 1 through 6, where like numbers are used to indicate like and corresponding parts.

Figure 1:
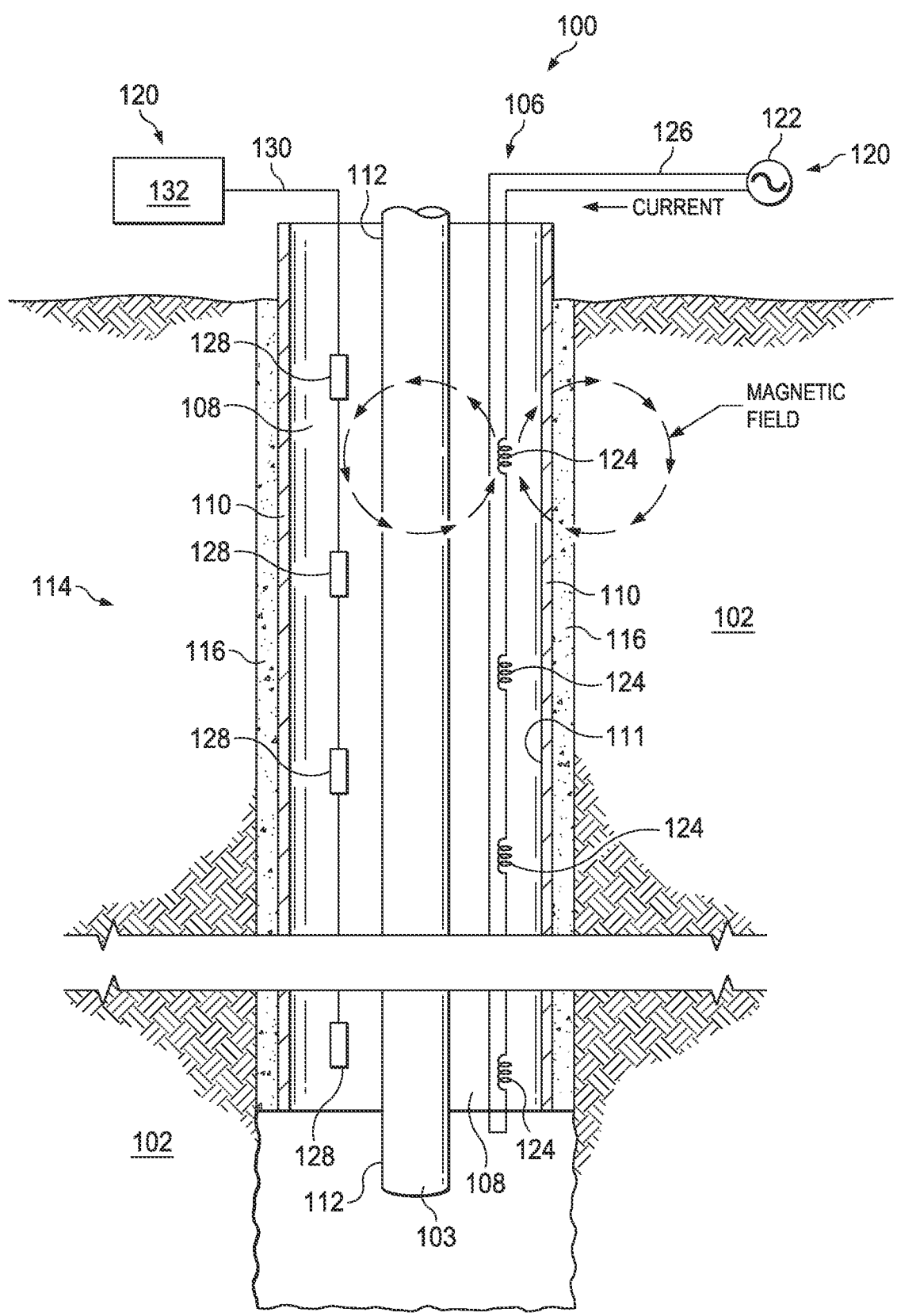
FIG. 1 illustrates an elevation view of an example embodiment of a subterranean operations system used in an illustrative wellbore environment.

FIG. 1 illustrates an elevation view of an example embodiment of a subterranean operations system used in an illustrative wellbore environment. Well system 100 may include well surface or well site 106. Various types of equipment such as a drilling rig, rotary table, drilling fluid or production fluid pumps, drilling fluid tanks (not expressly shown), and other drilling or production equipment may be located at well surface or well site 106. Although well system 100 is illustrated as a land based system, production operations incorporating teachings of the present disclosure may be satisfactorily used with offshore production systems located on offshore platforms, drill ships, semi-submersibles, and drilling barges (not expressly shown).

Well system 100 may include wellbore 114 that is defined in part by casing string 110 extending from well surface or well site 106 to a selected downhole location. The annular space between casing string 110 and wellbore 114 may be filled with cement 116 to hold casing string 110 in place. Well system 100 may also include production tubing 103, which may be used to produce oil, gas, and water from formation 102 via wellbore 114. The fluids may be directed to flow through production tubing 103. Annulus 108 may be defined by outside surface 112 of production tubing 103 and inside surface 111 of casing string 110.

As shown in FIG. 1, wellbore 114 may be substantially vertical (e.g., substantially perpendicular to well surface or well site 106). However, wellbore 114 may also be substantially horizontal (e.g., substantially parallel to well surface or well site 106) or at a desired angle or angles relative to vertical. Additionally, wellbore 114 may include one or more lateral wellbores formed at an angle from wellbore 114. The terms "uphole" and "downhole" may be used to describe the location of various components relative to the bottom or end of wellbore 114 shown in FIG. 1. For example, a first component described as uphole from a second component may be further away from the end of wellbore 114 than the second component. Similarly, a first component described as being downhole from a second component may be located closer to the end of wellbore 114 than the second component.

Formation monitoring system 120 may include power source 122 electrically coupled to transmitters 124 such that power source 122 may induce a magnetic field in formation 102. In some embodiments, transmitter 124 may include a magnetic induction coil, including for example, those described in further detail with respect to FIG. 2. Power source 122 may inject a current into wire 126, thereby causing transmitter 124 to create a magnetic field, some of which may penetrate into formation 102. Power source 122 may be an electrical supply grid, generator, battery, fuel cell, solar cell, and/or other suitable device configured to harvest energy. In some embodiments, the power consumption and electrical interfaces of power source 122 may be defined by appropriate oilfield power and safety standards, such as the Intelligent Well Interface Standardisation (IWIS) standard. Although shown outside of wellbore 114, power source 122 may be located wholly or partially within wellbore 114.

Formation monitoring system 120 may also include one or more magnetic induction sensors 128 to measure the magnetic induction, magnetic fields, or other properties associated with formation 102 surrounding wellbore 114 at various points along casing string 110. Magnetic induction sensor 128 may communicate measurements to optical interrogation system 132 via fiber optic cable 130. Magnetic induction sensor 128 may include one or more magnetic induction coils, including those described in further detail with respect to FIG. 2, coupled to an electro-optical transducer. The magnetic induction coils in magnetic induction sensor 128 may react to changes in magnetic fields or magnetic induction, including those originating in formation 102, to create an electric potential (e.g., voltage) that is applied to the electro-optical transducer.

In some embodiments, the electro-optical transducer of magnetic induction sensor 128 may be made of an electrostrictive material, including but not limited to lithium niobate, ferroelectric, or lead zirconium titanate, so that its shape changes in response to the application of an electric potential. The electro-optical transducer may be designed so that its impedance is high enough (e.g., approximately one megohm (M$\Omega$)) to create approximately a one-to-one ratio between the induced electric potential in the magnetic induction coil to the electric potential applied to the electro-optical transducer, regardless of the magnetic induction coil impedance. The change in shape of the electro-optical transducer may affect light on fiber optic cable 130 such that optical interrogation system 132 may determine the amount of electric potential applied to the electro-optical transducer of magnetic induction sensor 128, which in turn may be represent the amount of changes in magnetic fields or magnetic induction at magnetic induction sensor 128. In other embodiments, the electro-optical transducer of magnetic induction sensor 128 may be made of a magnetostrictive material, such as nickel, Terfenol D, or metglas, that responds to magnetic fields, and is coupled to (e.g., bonded to, coated on, or wrapped by fiber optic cable 130) such that optical interrogation system 132 may determine the amount of magnetic induction and/or magnetic fields at magnetic induction sensor 128. In other embodiments, the electro-optical transducer of magnetic induction sensor 128 may be a light emitting diode (LED) that converts electrical potential from the magnetic induction coil into light on fiber optic cable 130, whose intensity may vary proportionally to changes in magnetic fields or magnetic induction at magnetic induction sensor 128.

Formation monitoring system 120 may further include optical interrogation system 132 that gathers information about formation 102 through the array of magnetic induction sensors 128 located along casing string 110. Optical interrogation system 132 may be configured to communicate with magnetic induction sensors 128 via fiber optic cable 130 or via individual fibers within fiber optic cable 130. Optical interrogation system 132 may communicate with individual magnetic induction sensors 128 on fiber optic cable 130 through the use of time, wavelength, and/or frequency multiplexing. In some embodiments, fiber optic cable 130 may utilize a multi-mode optical fiber to increase the information transmission capacity over the cable. Accordingly, optical interrogation system 132 may communicate with individual magnetic induction sensors 128 sequentially or in parallel. In some embodiments, data stacking, averaging, and other processing techniques may be applied to signals on fiber optic cable 130 to compensate for signal noise and/or signal loss occurring in the formation monitoring system 120.

In some embodiments, optical interrogation system 132 may gather information about formation 102 by interrogating magnetic induction sensor 128 with any suitable fiber optic strain measurement methods, including but not limited to interferometric, fiber Bragg grating, fiber laser strain sensing, and intrinsic and extrinsic Fabry-Perot interferometric methods. For example, the electro-optical transducer in magnetic induction sensor 128 may be made of an electrostrictive material that changes shape in response to an electric potential, such as an electric potential created by the magnetic induction coils in magnetic induction sensor 128. Alternatively, the electro-optical transducer in magnetic induction sensor 128 may be made of a magnetostrictive material that changes shape in response to a magnetic field. In some embodiments, optical interrogation system 132 may produce a light signal with a light source (e.g., light emitting diode (LED)) on to fiber optic cable 130. The change in shape of the electro-optical transducer in magnetic induction sensor 128 may affect the light on fiber optic cable 130 such that optical interrogation system 132 may detect amplitude, frequency, and/or phase changes in the light on fiber optic cable 130. These changes to the light on fiber optic cable 130 may be indicative of the magnetic induction and/or magnetic fields in formation 102 as measured by magnetic induction sensor 128. In other embodiments, the electro-optical transducer of magnetic induction sensor 128 may be an LED that converts electrical potential created by magnetic induction and/or magnetic fields originating in formation 102 into light. The light may be transmitted to optical interrogation system 132 via fiber optic cable 130. The intensity of the light may be proportional to the magnitude of the magnetic induction and/or magnetic fields in formation 102 as measured by magnetic induction sensor 128. Accordingly, optical interrogation system 132 may be configured to monitor the magnetic induction and/or magnetic fields along various points of wellbore 114, providing insight into properties of and changes to formation 102.

Optical interrogation system 132 may include a computer (not expressly shown) that acts as a data acquisition system and/or data processing system to analyze measurements from magnetic induction sensors 128. The computer may also control production parameters to optimize production of fluids based on measurements from magnetic induction sensors 128 and/or information derived from these measurements. Production parameters may include, for example, the flow rate and pressure permitted from selected production zones, flow rate and pressure in selected injection zones, and the composition of the injection fluid, each of which may be controlled via computer controlled valves and pumps.

Generally, the computer in optical interrogation system 132 may include a central processing unit, memory, and a display. The well operator and/or engineers may interact with the computer through a user interface on the display and input devices such as keyboards, pointer devices, and touchscreens, and via output devices such as printers, monitors, and touchscreens. Software running on the computer may reside in the memory and/or on non-transient information storage media coupled to the computer. The computer may be implemented in different forms including, for example, an embedded computer permanently installed as part of optical interrogation system 132, a portable computer coupled to optical interrogation system 132, a remote desktop computer coupled to optical interrogation system 132 via a wireless and/or wired computer network, a mobile device, or any electronic device having a programmable processor and an interface for input and output.

Formation 102 may contain fluids, such as oil, gas, and water, dispersed among porous formations, such as sandstone and/or shale. During production, it may be beneficial to monitor, among other things, fluid saturations in formation 102 in order to allow well operators and engineers to make decisions relating to reservoir management, production enhancement, and/or intelligent completions of the well. Fluid displacements or a lack thereof may represent bypassed hydrocarbons or water flooding (e.g., as discussed in further detail in FIG. 5), and thus may be useful to effectively and efficiently produce from wellbore 114. Use of formation monitoring system 120, including one or more magnetic induction sensors 128 placed along various points inside casing string 110 to measure magnetic induction, magnetic fields, or other properties of formation 102 along various points of casing string 110, may allow monitoring of formation 102 without interrupting operation (e.g., production, injection, and monitoring) of wellbore 114. Furthermore, formation monitoring system 120 may be used to, among other things, supplement reservoir management workflows so as to optimize production and injection practices, and advise intervention strategies and practices in advance of unfavorable or unexpected production scenarios.

During operation of formation monitoring system 120, power source 122 may inject a pulse of current into wire 126 in order to create a magnetic field in formation 102. In some embodiments, the pulse may be low frequency in order to maximize penetration through casing string 110 into formation 102. In one embodiment, the current waveform from power source 122 may be sinusoidal with a frequency between approximately 1 Hertz (Hz) and 1 Kilohertz (kHz). Additionally, the current waveform may be a regular periodic bipolar square waveform with a fifty percent (50%) duty cycle and base frequency between approximately 0.01 Hz and approximately 1 kHz.

The application of a current from power source 122 may cause transmitter 124 to induce currents within formation 102. In some embodiments, transmitter 124 may include a magnetic induction coil, including those disclosed in FIG. 2. A magnetic field may be generated as the current from power source 122 flows into the coils of the magnetic induction coil in transmitter 124. The resulting magnetic field may propagate into formation 102. The magnitude and distribution of the magnetic field into formation 102 may vary according to the current at power source 122 and the properties of the elements surrounding transmitter 124, including for example, casing string 110, production tubing 103, cement 116, and formation 102.

In some embodiments, the magnetic field generated by transmitter 124 may be targeted to specific regions of formation 102 in order to improve the accuracy of measurements made by formation monitoring system 120. For example, materials within wellbore 114 may be removed or modified to allow for a higher penetration of the magnetic fields into formation 102. Casing string 110 may be perforated in certain regions, thereby allowing the magnetic field to better permeate into formation 102 in those regions. Further, transmitter 124 may be selectively placed in close proximity to a particular region of interest, such as a production area or reservoir, within formation 102 to increase the magnetic field penetrating formation 102 near that region. A higher penetration of magnetic field into formation 102 may result in a higher secondary magnetic field originating in formation 102 for magnetic induction sensors 128 to detect, thereby improving the signal-to-noise ratio of the monitoring system. Also, casing string 110 may be insulated in areas with material like fiberglass or steel, in order to control or reduce the interference of magnetic fields created by different transmitters 124. A higher precision of measurements may be possible with formation monitoring system 120 by controlling the magnetic field applied to formation 102.

The magnetic field created by transmitters 124 may cause a secondary magnetic field to be induced in formation 102, the strength of which is related to the resistivity of formation 102 surrounding wellbore 114. A change in the magnetic field created by transmitter 124 (e.g., by fluctuating the current into transmitter 124) may induce a current, sometimes referred to as an eddy current, in formation 102 whose magnitude is related to the conductivity of formation 102. In turn, the current induced in formation 102 may create a secondary magnetic field that opposes the primary magnetic field created by transmitter 124. Magnetic induction sensors 208 may be configured to measure the strength of the secondary magnetic field and communicate these measurements to optical interrogator 132. Thus, formation monitoring system 120 may ascertain EM properties (e.g., the resistivity of formation 102) surrounding wellbore 114 by monitoring the measurements of the various magnetic induction sensors 128 along wellbore 114. EM properties of formation 102 may provide insight as to the structure, fluid saturation, porosity, and/or permeability of the formation.

Adding the ability to process and store measurements from magnetic induction sensor 128 over time, may enable the derivation of additional information about formation 102. Beyond static data from one-time measurements, quasi-static data and dynamic data may also be compiled about formation 102. Such information may inform the well operator of changes in the structure, resistivity, fluid substitution (e.g., injected water replacing oil or gas), fluid saturation, porosity, and/or permeability of formation 102 as these changes occur over time. For example, changes in EM measurements over time may indicate the occurrence of fluid substitution in the formation, such as water flooding discussed in FIG. 5. Any and all of the information collected and/or generated by formation monitoring system 120 may be used for reservoir management, production enhancement, and/or controlling intelligent well completions.

To ensure the continued functioning and accuracy of the formation monitoring system 120, magnetic induction sensor 128 and/or fiber optic cable 130 may be outfitted with special protection. For example, magnetic induction sensor 128 may be placed in a durable housing (not expressly shown) to protect the sensor during deployment into casing string 110. Also, fiber optic cable 130 may be part of a protective tubing encapsulated cable (TEC). The durable housing and TEC may also protect magnetic induction sensor 128 and fiber optic cable 130 from the harsh conditions that exist in wellbore 114. The housing containing magnetic induction sensor 128 may be made from electrically non-conductive, high strength material such as carbon fiber, fiber glass, or ceramic, and may be rated to resist abrasion, crushing, or any other type of mechanical failure.

Magnetic induction sensor 128 may further include a global positioning system (GPS) unit that provides time-synchronization. Information from the GPS unit within magnetic induction sensor 128 may also be communicated by electrical and/or optical methods to optical interrogation system 132 for further processing of the acquired information. In some embodiments, the GPS unit and magnetic induction sensor 128 may be separate elements of formation monitoring system 120.

Figure 2A:
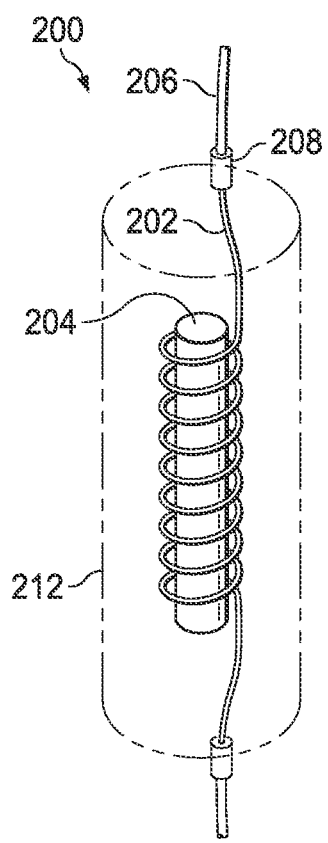
FIG. 2 illustrates an elevation view of magnetic induction coils for use in an illustrative formation monitoring system.
Figure 2B:
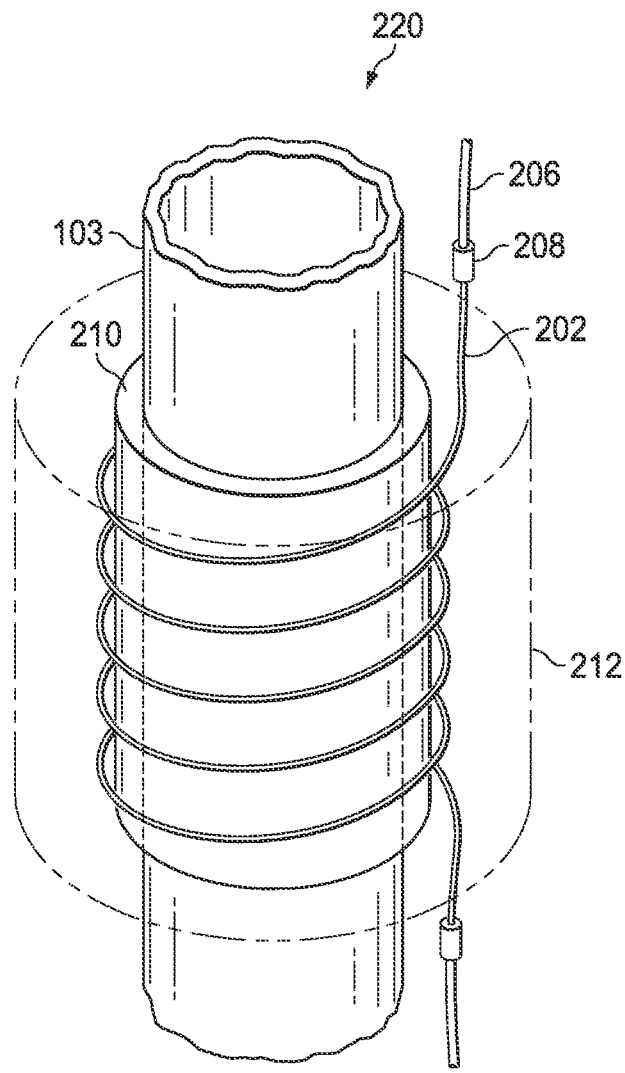

Formation monitoring system 120 may use magnetic induction coils to create and measure magnetic induction and/or magnetic fields within formation 102. FIG. 2 illustrates an elevation view of magnetic induction coils for use in an illustrative formation monitoring system. In FIG. 2A, wire 202 is coiled around core 204 to form magnetic induction coil 200. Wire 202 may be made of any electrically conductive material, including for example, copper or aluminum. Core 204 may be composed of any magnetic material, such as ferrite, Permalloy, Mu-Metal, or metallic glass, that increases the magnetic field and thus the inductance of magnetic induction coil 200. In some embodiments, more than one magnetic induction coil 200 may share a single common core 204. In FIG. 2B, wire 202 is coiled around production tubing 103 to form induction coil 220. A layer of magnetic material 210, such as ferrite, Permalloy, Mu-Metal, or metallic glass, may be placed between wire 202 and production tubing 103 to increase the inductance of magnetic induction coil 220. In some embodiments, magnetic induction coils 200 and 220 may be formed without core 204 and magnetic material 210. Wire 202 may couple to wire 206 via connector 208, coupling the magnetic induction coil to another element in the formation monitoring system 120, like a power supply or an electro-optical transducer. In some embodiments, wires 202 and 206 may be the same wire. Durable housing 212 may protect magnetic induction coils 200 and 220 from damage during deployment into casing string 110 as well from the harsh conditions that exist in wellbore 114.

Figure 3A:
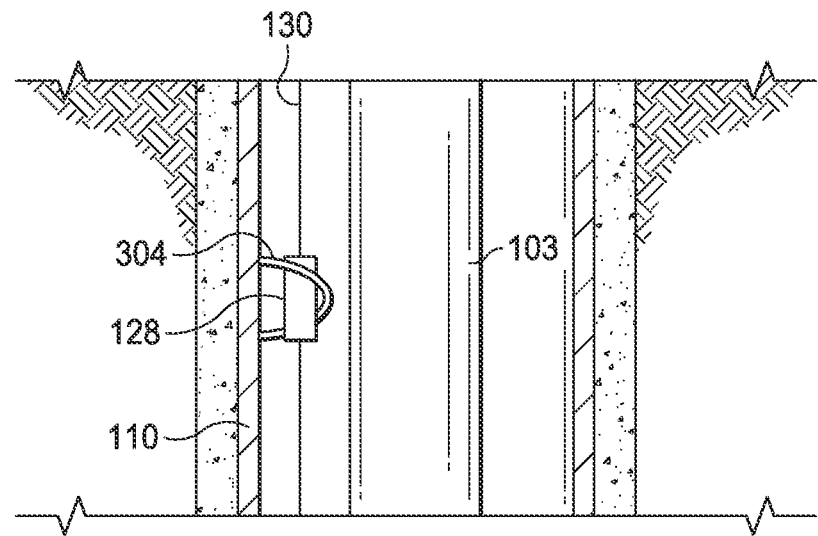
FIG. 3A illustrates an elevation view of a magnetic induction sensor coupled to the inside surface of a casing string.

Deployment of magnetic induction sensors 128 and fiber optic cable 130 within casing string 110 may be accomplished in various ways. In some embodiments, magnetic induction sensor 128 and fiber optic cable 130 may be coupled to casing string 110 during manufacturing of casing string 110, during preparation of casing string 110 for permanent deployment into wellbore 114, and/or with the use of downhole tools after casing string 110 is deployed within wellbore 114. FIG. 3A illustrates an elevation view of a magnetic induction sensor coupled to the inside surface of a casing string. In some embodiments, magnetic induction sensor 128 may be coupled to fiber optic cable 130. Therefore, holding magnetic induction sensor 128 in place may also hold fiber optic cable 130 in place, and vice versa. Accordingly, clamp 304 may be placed around magnetic induction sensor 128, fiber optic cable 130, or both in order to hold magnetic induction sensor 128 and fiber optic cable 130 in place within casing string 110. In some embodiments, multiple clamps 304 may be used to secure magnetic induction sensor 128 and fiber optic cable 130 independently. In place of or in addition to clamp 304, magnetic induction sensor 128 and fiber optic cable 130 may be coupled to casing string 110 by any other suitable manner, including but not limited to adhesive, hooks, straps, bands, or magnets.

Figure 3B:
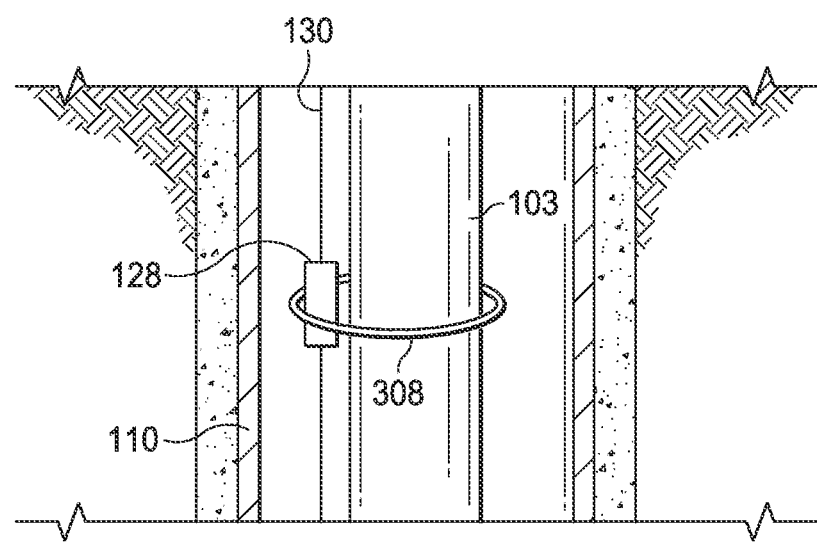
FIG. 3B illustrates an elevation view of a magnetic induction sensor coupled to a production tubing.

In some embodiments, magnetic induction sensors 128 and fiber optic cable 130 may be deployed into casing string 110 with production tubing 103. By coupling magnetic induction sensors 128 and fiber optic cable 130 to production tubing 103, the monitoring equipment may be lowered into wellbore 114 with production tubing 103. For example, FIG. 3B illustrates an elevation view of a magnetic induction sensor coupled to a production tubing. Magnetic induction sensor 128 and fiber optic cable 130 may be coupled to production tubing 103 by clamp 308 holding magnetic induction sensor 128 in place. Through its coupling to magnetic induction sensor 128, fiber optic cable 130 may also be held in place by clamp 308. In some embodiments, clamp 308 may secure fiber optic 130 to production tubing 103 and magnetic induction sensor 128 may be held in place by way its coupling fiber optic cable 130. More than one clamp 308 may be used to secure magnetic induction sensor 128 and fiber optic cable 130 separately to production tubing 103. Although clamp 308 is expressly shown, any other method for coupling magnetic induction sensor 128 and fiber optic cable 130 to casing string 110 may be used, including but not limited to adhesive, hooks, straps, bands, or magnets. By their coupling to production tubing 103, magnetic induction sensor 128 and fiber optic cable 130 may be deployed as production tubing 103 is inserted into casing string 110.

Similarly, transmitters 124 and wire 126 may be deployed in any of the manners disclosed above with respect to magnetic induction sensor 128 and fiber optic cable 130 in FIGS. 3A and 3B. For example, transmitters 124 and wire 126 may be coupled to the casing string 110 or to production tubing. In one embodiment, magnetic induction sensor 128, fiber optic cable 130, transmitter 124, and wire 126 may be coupled to casing string 110 or production tubing 103 with the same device(s) (e.g., clamps, adhesive, hooks, straps, bands, or magnets). Also, fiber optic cable 130 and wire 126 may be placed within the same or different protective tubing encapsulated cable to protect them during installation into casing string 110 and from the harsh conditions that exist in wellbore 114.

Deploying devices via production tubing 103 may allow for an array of magnetic induction sensors 128 and/or transmitters 124 to be placed within wellbore 114 during the deployment of production tubing 103. One advantage of this deployment method may be easier access for repairing and/or replacing monitoring equipment. For example, access to magnetic induction sensors 128 and fiber optic cable 130 may be achieved by extracting production tubing 103 from the wellbore 114. Another advantage of deployment by production tubing 103 is that the array of magnetic induction sensors 128 and/or transmitters 124 may be deployed in existing wells without costly well intervention. Utilizing an array of devices may ensure redundancy of the formation monitoring system should one or more of the sensors or transmitters stop working. Additionally, multiple magnetic induction sensors 128 may be placed at different locations along casing string 110 so that a higher granularity of information is available for formation 102.

Figure 4:
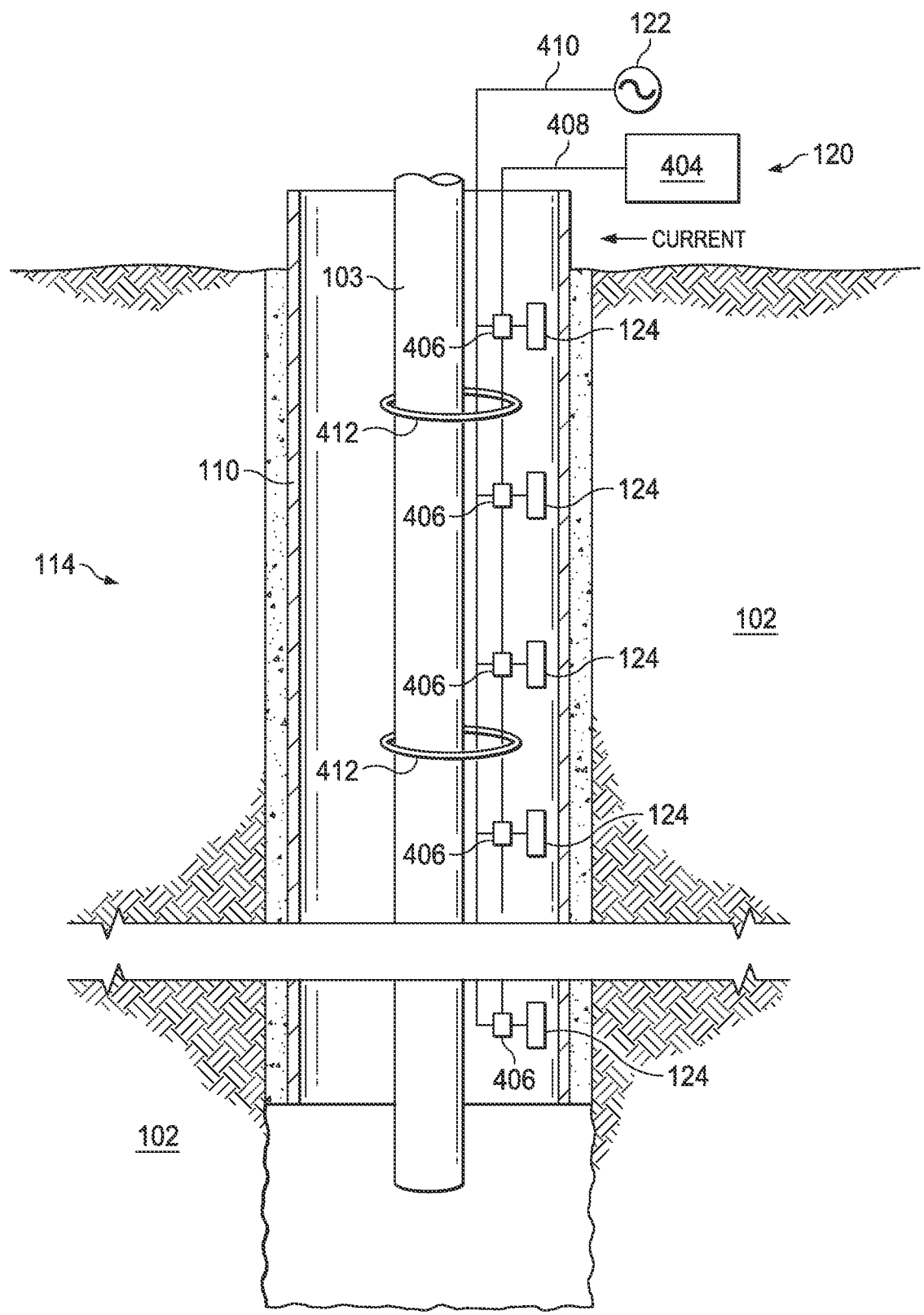
FIG. 4 illustrates an elevation view of a downhole electromagnetic formation monitoring system with multiple excitation points deployed within the casing string of a wellbore.

To concentrate or isolate magnetic field in particular areas of interest, it may be desirable to have independent control over transmitters 124 located along casing string 110. FIG. 4 illustrates an elevation view of a formation monitoring system with multiple transmitters 124 deployed within casing string 110. Multiplex controller 404 may control switches 406, determining which transmitter 124 receives current (e.g., an electrical excitation) from power source 122. Wire 408 may couple control switches 406 to multiplex controller 404. Wire 410 may electrically couple electrode 402 to power source 122 when switch 406 is activated. In some embodiments, control switch 406 and transmitter 124 may be manufactured as a single element. Transmitter 124, switch 406, wire 408, and wire 410 may be coupled to production tubing 103 by clamps 412 for deployment via production tubing 103. Alternatively, transmitter 124, switch 406, wire 408, and wire 410 may be coupled to the casing string 110 or to production tubing 103 in the manners disclosed with respect to FIGS. 3A and 3B. Magnetic induction sensor 128, fiber optic cable 130, transmitter 124, switch 406, wire 408, and wire 410 may be coupled to casing string 110 or production tubing 103 with the same device(s) (e.g., clamps, adhesive, hooks, straps, bands, or magnets). Also, fiber optic cable 130, wire 408, and wire 410 may be placed within the same or different protective tubing encapsulated cable to protect them during installation into casing string 110 and from the harsh conditions that exist in wellbore 114.

Multiplex controller 404 may provide control for switches 406 and may determine which of transmitters 124 receive current from power source 122. For example, multiplex controller 404 may sequentially excite transmitters 124 with current, excite all transmitters 124 at the same time, and/or prevent the excitation of all transmitters 124, effectively isolating power source 122 from the transmitters. Upon receiving current from power source 122, transmitter 124 may generate a primary magnetic field, some of which may permeate into formation 102.

Placement of transmitter 124 along casing string 110 may be chosen for a specific purpose based on prior analysis. For example, frequency of the transmitter current, depth of the investigation, target region of the formation, and/or the size of the array of magnetic induction sensors 128 may be considered in determining number and placement of transmitters 124. In some embodiments, transmitter 124 may be placed between and/or near magnetic induction sensor 128. Such a placement may allow for a higher accuracy for measurements made by magnetic induction sensor 128 as the magnetic field from transmitter 124 may be directly targeted to the particular region of interest.

Figure 5:
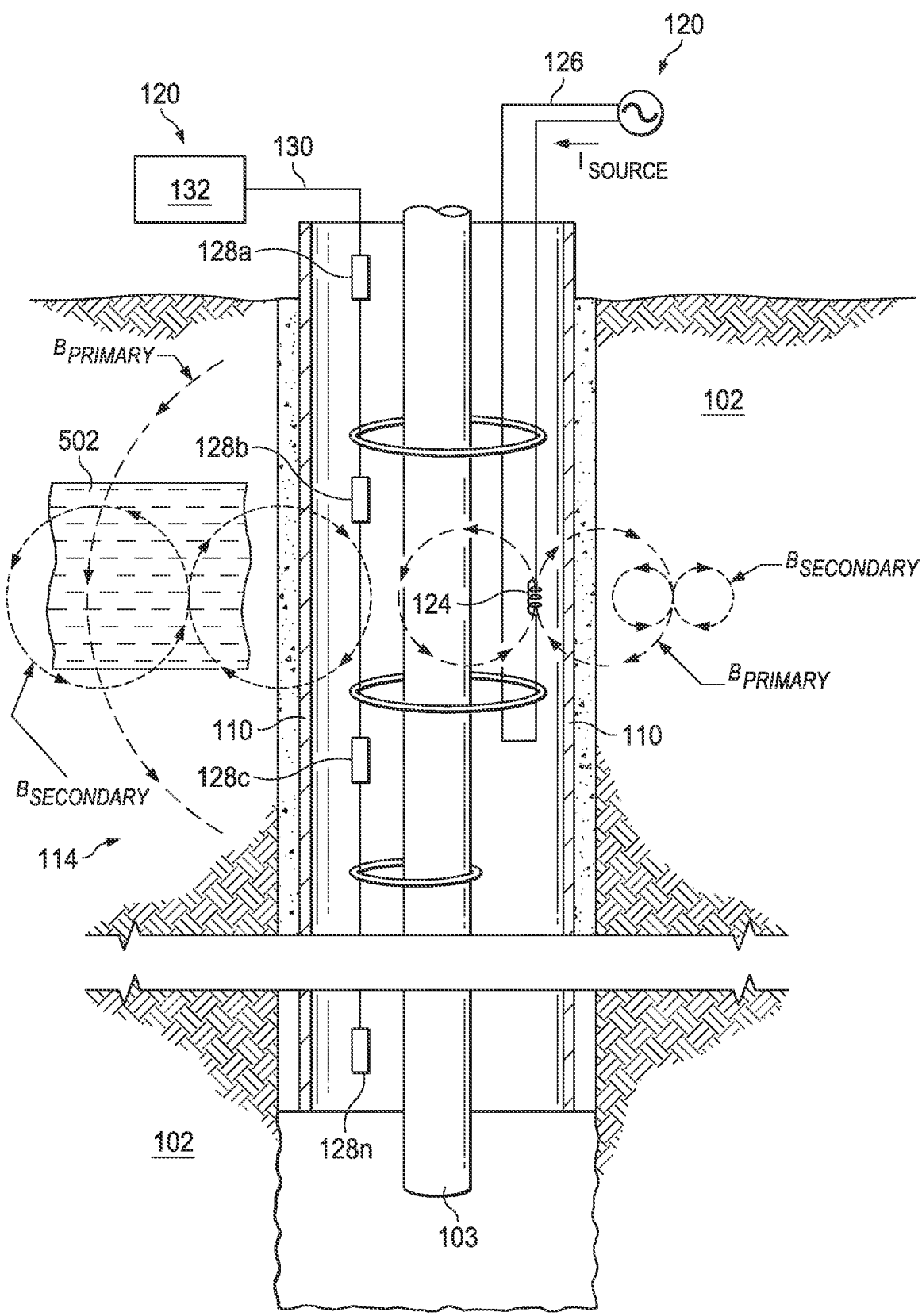
FIG. 5 illustrates an elevation view of a downhole electromagnetic formation monitoring system as applied to the detection of water flooding.

FIG. 5 illustrates an elevation view of a downhole electromagnetic formation monitoring system as applied to the detection of water flooding. An array of magnetic induction sensors 128 may be deployed within casing string 110 via production tubing 103 in accordance with this disclosure. Power source 122 may be electrically coupled to transmitter 124 via wire 126, providing an alternating current $I_{source}$ to the magnetic induction coil of transmitter 124. In response to current $I_{source}$, transmitter 124 may create a primary magnetic induction $B_{primary}$ that permeates into formation 102, attenuating with distance from transmitter 124.

The primary magnetic induction $B_{primary}$ may induce currents in formation 102, where the magnitudes of the currents relate to the resistivity of the formation 102 at a particular region. The induced currents in the formation may in turn cause a secondary magnetic induction $B_{secondary}$ originating in formation 102 that opposes primary magnetic induction $B_{primary}$. The strength of the secondary magnetic induction $B_{secondary}$ may represent the magnitude of the induced currents, and therefore the resistivity of formation 102 surrounding wellbore 114.

At time $T_0$, optical interrogation system 132 may interrogate magnetic induction sensors 128 to determine the strength of the secondary magnetic induction $B_{secondary}$ coming from formation 102. Specifically, secondary magnetic induction $B_{secondary}$ may induce an electric potential in the magnetic induction coil within magnetic induction sensors 128, which in turn may be applied to the electro-optical transducer in the sensors. Optical interrogation system 132 may obtain measurements of secondary magnetic induction $B_{secondary}$ at magnetic induction sensors 128 via fiber optic cable 130. Optical interrogation system 132 may store or process these measurements with a computer and/or communicate the measurements to a separate system (e.g., a system controlling well production). From these measurements, a resistivity profile may be determined for the region of formation 102 located near magnetic induction sensors 128. The resistivity profile may represent measurements as taken at time $T_0$.

At a later time $T_1$, optical interrogation system 132 may again interrogate magnetic induction sensors 128 to determine the strength of secondary magnetic induction $B_{secondary}$ at the various points along casing string 110. Measurements from magnetic induction sensors 128 may be communicated to optical interrogation system 132 via fiber optic cable 130. Optical interrogation system 132 may store or process these measurements with the computer and/or communicate the measurements to a separate system.

By comparing the measurements at times $T_0$ and $T_1$, optical interrogation system 132 may detect changes in formation 102 surrounding wellbore 114 occurring over time. Changes in formation 102 may occur for a variety of reasons, including but not limited to, water flooding. Water flooding is the injection of water into a reservoir to stimulate oil and/or gas production from the reservoir. Water flood 502 may not be present in formation 102 at time $T_0$, but may be the result of production operations occurring between time $T_0$ and $T_1$. Increased water saturation of formation 102 may cause the resistivity of the formation to decrease. Therefore, at time $T_1$, the lower resistivity of formation 102 near water flood 502 may result in higher induced currents in formation 102 in response to the primary magnetic induction $B_{primary}$ created by transmitter 124. As a result of the higher induced currents in formation 102, the resulting secondary magnetic induction $B_{secondary}$ originating in formation 102 may also be higher at time $T_1$ as compared to time $T_0$. Thus, the magnitude of secondary magnetic induction $B_{secondary}$ may vary inversely proportional to the resistivity of formation 102. Magnetic induction sensors 128 may detect the decrease in magnetic secondary magnetic induction $B_{secondary}$ at time $T_1$, thus informing the well operator that water flooding has reached close proximity to wellbore 114. The magnitude of change in secondary magnetic induction $B_{secondary}$ measured by the various magnetic induction sensors 128 may also reflect the size and location of water flood 502. For example, magnetic induction sensors 128b and 128c, the sensors closest to water flood 502, may measure a higher variation in secondary magnetic induction $B_{secondary}$ at time $T_1$ as compared to magnetic induction sensors 128a and 128n. Higher variation at magnetic induction sensors 128b and 128c may indicate that water flood 502 is located nearest those sensors. Thus, measurements from the various magnetic induction sensors 128 may help determine the magnitude and location of various changes in formation 102.

Although described with respect to water flooding, the techniques in FIG. 5 may be used to detect any other changes in formation 102. For example, monitoring formation 102 over time may help realize bypassed oil and the depletion of certain materials from the formation and nearby reservoirs. Formation monitoring may also advise production parameters, including but not limited to flow rate/pressure permitted from selected production zones, flow rate/pressure in selected injection zones, and the composition of the injection fluid. Likewise, formation monitoring data may also determine better completion and perforation policies, and may further enable optimization of hydrocarbon production by enabling the well operator to track flows associated with each perforation and accordingly selectively block fluid influxes.

Additional magnetic induction coils, or bucking coils, may be added to formation monitoring system 120 in order to increase the measurement sensitivity of formation monitoring system 120. For example, bucking coils may be placed within wellbore 114 to offset the primary magnetic field generated by transmitters 124, thereby allowing magnetic induction sensors 128 to detect even smaller magnetic signals from formation 102. Formation monitoring system 120 may be primarily concerned with detecting the secondary magnetic induction $B_{secondary}$ permeating from formation 102, not the primary magnetic induction $B_{primary}$ generated by transmitters 124. By reducing primary magnetic induction $B_{primary}$ at magnetic induction sensors 128, bucking coils may increase the signal-to-noise ratio (e.g., $B_{secondary}$ compared to the total magnetic field at magnetic induction sensor 128), potentially increasing the measurement sensitivity and accuracy of formation monitoring system 120.

Figure 6A:
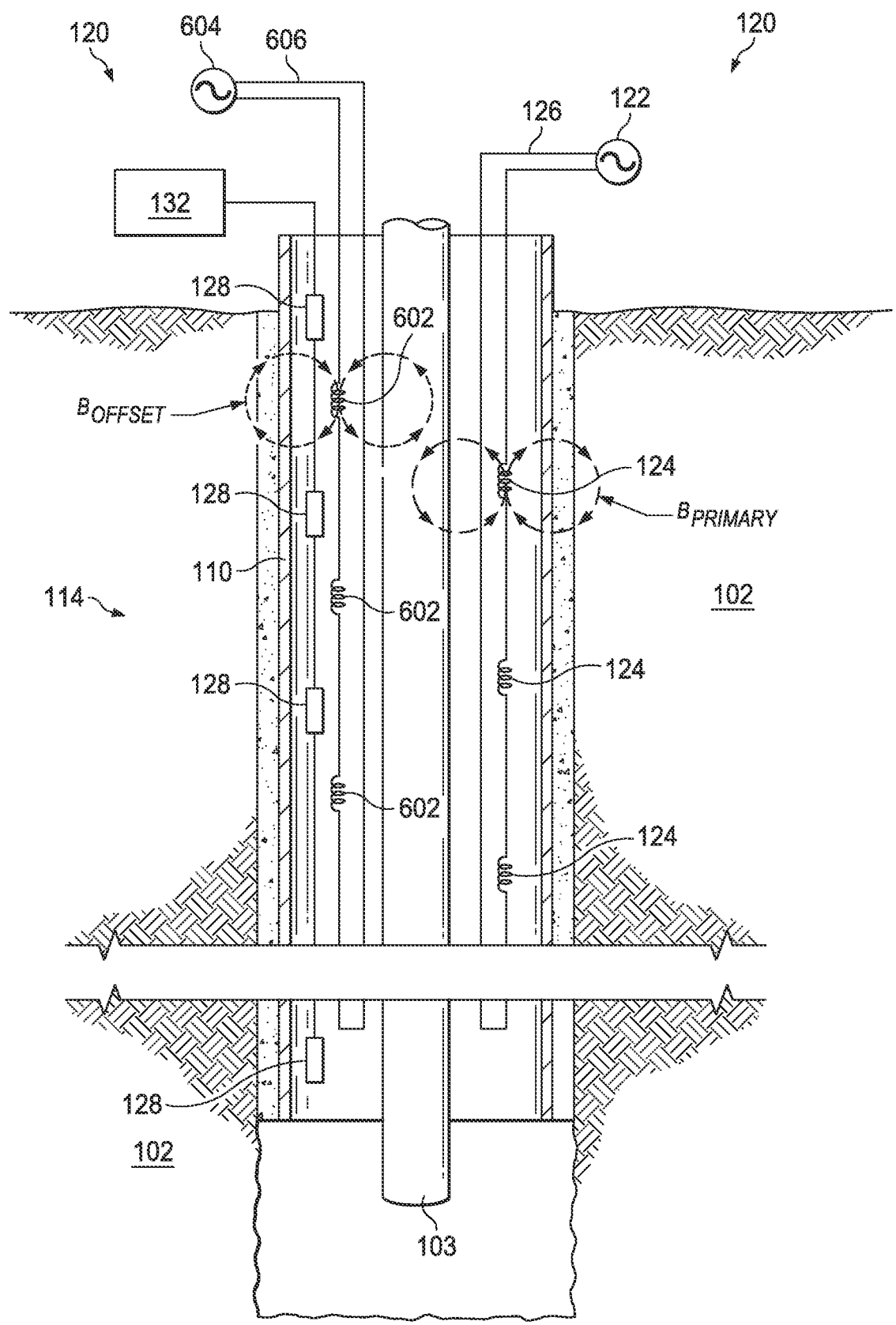
FIG. 6 illustrates an elevation view of an illustrative formation monitoring system including bucking coils.
Figure 6B:
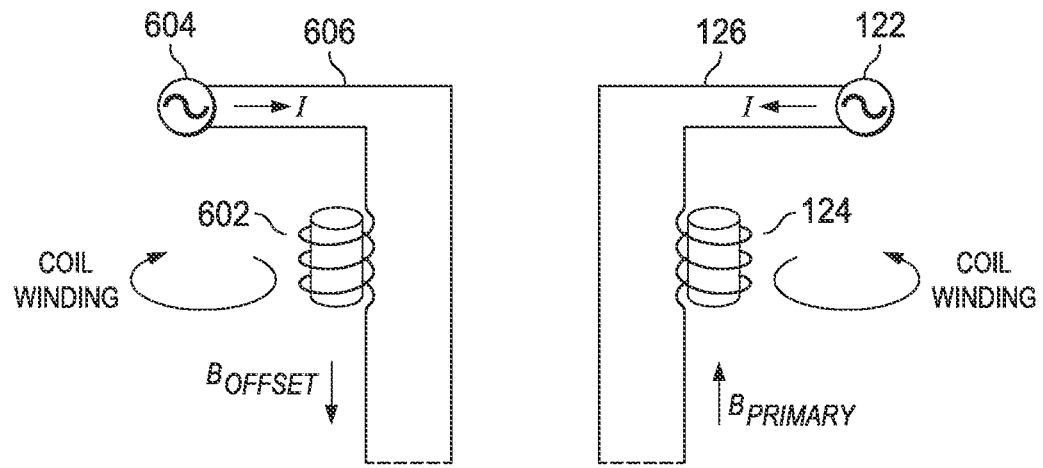

Bucking coils may reduce and minimize extraneous magnetic induction and/or magnetic fields existing near magnetic induction sensors 128, effectively reducing or eliminating the noise in the wellbore 114. FIG. 6 illustrates an elevation view of an illustrative formation monitoring system including bucking coils. In some embodiments, formation monitoring system 120 may include one or more bucking coils 602 placed along wellbore 114. Bucking coil 602 may represent a magnetic induction coil, including for example, magnetic induction coils 200 and 220 disclosed with respect to FIGS. 2A and 2B. Power source 604 may be electrically coupled to bucking coil 602 such that power source 604 applies a current to wire 606, thereby inducing an offset magnetic induction $B_{offset}$ to oppose or offset the primary magnetic induction $B_{primary}$ and any other magnetic induction and/or magnetic fields existing near magnetic induction sensors 128.

Figure 6C:
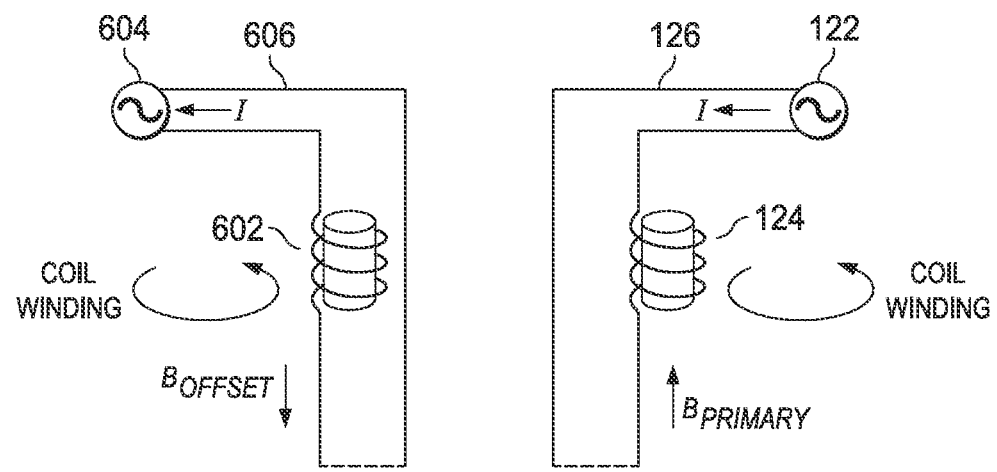

In order to produce an offset magnetic induction $B_{offset}$ in the opposite direction of primary magnetic induction $B_{primary}$, bucking coil 602 may include a coil winding or current in the opposite direction as transmitter 124. For example, in FIG. 6B, wire 606 in bucking coil 602 is wound clockwise, opposite the counterclockwise winding of wire 124 in transmitter 124. With the same direction of current I in wires 606 and 126, the opposite winding direction of wire 606 will result in an offset magnetic induction $B_{offset}$ opposite that of primary magnetic induction $B_{primary}$. A similar result may be achieved by modifying the direction of current I into bucking coil 602. FIG. 6C illustrates bucking coil 602 and transmitter 124 with the same coil winding direction and opposite current into the magnetic induction coil. Power source 604 may inject current I into bucking coil 602 in the opposite direction of the current power source 122 injects in transmitter 124, thereby creating an offset magnetic induction $B_{offset}$ in the opposite direction as primary magnetic induction $B_{primary}$.

The magnitude of offset magnetic induction $B_{offset}$ generated by bucking coil 602 may be controlled by formation monitoring system 120 so to minimize the extraneous magnetic induction and/or magnetic fields at magnetic induction sensors 128. As an example and not by way of limitation, the frequency, amplitude, and/or phase of the current supplied by power source 604 to bucking coil 602 may be controlled to affect offset magnetic induction $B_{offset}$ at any time. Accordingly, offset magnetic induction $B_{offset}$ may be selected or adjusted so to minimize or eliminate the magnetic induction and/or fields representing noise (e.g., primary magnetic induction $B_{primary}$) near magnetic induction sensor 128. Limiting the amount of noise at magnetic induction sensor 128 may result in a higher signal-to-noise ratio, while ensuring the sensor operates within its finite dynamic range of operation. Additionally, magnetic induction sensor 128 may be selected for a higher accuracy and sensitivity in the expected range of secondary magnetic induction $B_{secondary}$, the signal of importance to formation monitoring system 120.

Similar to power source 122, power source 604 may be an electrical supply grid, generator, battery, fuel cell, solar cell, and/or other suitable device configured to harvest energy. In some embodiments, the power consumption and electrical interfaces of power source 604 may be defined by appropriate oilfield power and safety standards, such as the Intelligent Well Interface Standardisation (IWIS) standard. Although shown outside of wellbore 114, power source 604 may be located wholly or partially within wellbore 114. Further, although power sources 122 and 604 are shown as separate elements in FIG. 6, in some embodiments, they may be a single power source.

Additionally, bucking coil 602 may be deployed within wellbore 114 in any of the methods disclosed above with respect to magnetic induction sensor 128 and transmitter 124 in FIGS. 3A and 3B. For example, bucking coil 602 and wire 606 may be coupled to the casing string 110 during manufacturing of casing string 110, during preparation of casing string 110 for permanent deployment into wellbore 114, and/or with the use of downhole tools after casing string 110 is deployed within wellbore 114. Alternatively, bucking coil 602 and wire 606 may be coupled to production tubing 103 and deployed during the placement of production tubing 103 into casing string 110.

The formation monitoring data acquired by this disclosure may be integrated with other available geophysical data, like seismic or gravity data, to improve the resolution of a reservoir model using methods of cooperative or joint modeling, inversion, or imaging. Additionally, the formation monitoring data may be integrated with production data, including for example, volumetrics or chemical tracing, to improve the resolution of a reservoir model using methods of cooperative or joint modeling, inversion, or imaging. To integrate data across multiple systems, the formation monitoring system described herein may provide an application programmable interface (API) for interfacing and communicating data with other systems or software. In some embodiments, features of the disclosed formation monitoring system may be packaged as part of an integrated earth modeling software package, like Halliburton Company's DecisionSpace® Production.

Downhole formation monitoring systems and methods incorporating teachings of the present disclosure may be satisfactorily used with wells located on offshore platforms, drill ships, semi-submersibles and drilling barges (not expressly shown). Moreover, the teachings of the present disclosure may be deployed in vertical, high angle, or horizontal wells. Moreover, the teachings of the present disclosure may be applied in the production of any subsurface minerals, including but not limited to oil, gas, water, carbon dioxide, and ground water.

Embodiments disclosed herein include:

A. A through-casing formation monitoring system including a casing string positioned within a wellbore, a power source electrically coupled to a first transmitter configured to produce a magnetic field, a magnetic induction sensor positioned within the casing string such that the magnetic induction sensor allows a continued operation of the wellbore, a fiber optic cable coupled to an electro-optical transducer within the magnetic induction sensor, and an optical interrogation system configured to receive a measurement from the magnetic induction sensor via the fiber optic cable.

B. A method of monitoring a formation including positioning a magnetic induction sensor within a casing string positioned within a wellbore such that the magnetic induction sensor allows a continued operation of the wellbore, electrically coupling a first transmitter to a power source, injecting a current from the power source into the first transmitter to produce a primary magnetic field in the wellbore, measuring a magnetic induction at the magnetic induction sensor, and communicating the magnetic induction from the magnetic induction sensor to an optical interrogation system via a fiber optic cable.

C. A sensor device including a magnetic induction coil positioned within a casing string in a wellbore, and an electro-optical transducer electrically coupled to the magnetic induction coil, wherein the magnetic induction coil is configured to apply an electric potential to the electro-optical transducer in response to a magnetic induction.

Each of the embodiments A and B may have one or more of the following additional elements in any combination: Element 1: a second transmitter electrically coupled to the power source and configured to produce a second magnetic field. Element 2: a multiplex controller configured to select at least one of the first transmitter and the second transmitter to receive a current from the power source. Element 3: wherein the multiplex controller is further configured to select the first transmitter and the second transmitter to receive the current in sequential order. Element 4: wherein the multiplex controller is further configured to select the first transmitter and the second transmitter to receive the current at the same time. Element 5: wherein the first transmitter and the second transmitter are coupled to a production tubing positioned within the casing string. Element 6: wherein the magnetic induction sensor is coupled to a production tubing positioned within the casing string. Element 7: wherein the first transmitter comprises a wire coiled around a magnetic core. Element 8: wherein the magnetic core is a production tubing positioned within the casing string. Element 9: wherein the optical interrogation system is further configured to calculate a parameter of a formation near the wellbore based on the measurement from the magnetic induction sensor. Element 10: wherein the parameter is a resistivity of the formation, a change in resistivity of the formation over time, an approximate location of the change in resistivity of the formation, and a fluid saturation of the formation.

Embodiment C may have one or more of the following additional elements in any combination: Element 1: wherein the magnetic induction coil comprises a wire coiled around a magnetic core. Element 2: wherein the magnetic core is a production tubing positioned within the casing string. Element 3: wherein the electro-optical transducer is communicatively coupled to an optical interrogation system via a fiber optic cable. Element 4: wherein the electro-optical transducer is configured to change shape in response to the electric potential on the magnetic induction coil. Element 5: wherein the electro-optical transducer is configured to produce a light signal in response to an electric potential on the magnetic induction coil. Element 6: wherein the magnetic induction coil and the electro-optical transducer are coupled to a production tubing positioned within the casing string.

Although the present disclosure and its advantages have been described in detail, it should be understood that various changes, substitutions and alterations can be made herein without departing from the spirit and scope of the disclosure as defined by the following claims. For example, while the embodiment discussed describes deploying the magnetic induction sensors via the production tubing, the magnetic induction sensors may be placed within the casing string in any manner that allows the magnetic induction sensors to make EM measurements through the casing string while not interfering with production from the wellbore.

What is claimed is:

1. A through-casing formation monitoring system, comprising:
   a casing string positioned within a wellbore;
   a production tubing positioned within the casing string;
   a power source electrically coupled to a first transmitter configured to produce a magnetic field, the first transmitter comprising a wire coiled around a magnetic core, wherein the magnetic core is the production tubing;
   a magnetic induction sensor positioned between the casing string and the production tubing such that the magnetic induction sensor allows a continued operation of the wellbore and a continued monitoring of a formation;
   a fiber optic cable coupled to an electro-optical transducer within the magnetic induction sensor; and
   an optical interrogation system configured to receive a measurement from the magnetic induction sensor via the fiber optic cable.

2. The system of claim 1, further comprising a second transmitter electrically coupled to the power source and configured to produce a second magnetic field.

3. The system of claim 2, wherein the first transmitter and the second transmitter are coupled to the production tubing positioned within the casing string.

4. The system of claim 2, further comprising a multiplex controller configured to select at least one of the first transmitter and the second transmitter to receive a current from the power source.

5. The system of claim 4, wherein the multiplex controller is further configured to select the first transmitter and the second transmitter to receive the current in sequential order.

6. The system of claim 4, wherein the multiplex controller is further configured to select the first transmitter and the second transmitter to receive the current at the same time.

7. The system of claim 1, wherein the magnetic induction sensor is coupled to the production tubing positioned within the casing string.

8. The system of claim 1, wherein the optical interrogation system is further configured to calculate a parameter of the formation near the wellbore based on the measurement from the magnetic induction sensor.

9. The system of claim 8, wherein the parameter is at least one of a resistivity of the formation, a change in resistivity of the formation over time, an approximate location of the change in resistivity of the formation, and a fluid saturation of the formation.

10. A method of monitoring a formation, comprising:
    positioning a magnetic induction sensor between a casing string positioned within a wellbore and a production tubing positioned within the casing string such that the magnetic induction sensor allows a continued operation of the wellbore and a continued monitoring of a formation;

electrically coupling a first transmitter to a power source, the first transmitter comprising a wire coiled around a magnetic core, wherein the magnetic core is the production tubing;

injecting a current from the power source into the first transmitter to produce a primary magnetic field in the wellbore;

measuring a magnetic induction at the magnetic induction sensor; and communicating the magnetic induction from the magnetic induction sensor to an optical interrogation system via a fiber optic cable.

11. The method of claim 10, further comprising electrically coupling a second transmitter to the power source.

12. The method of claim 11, wherein the current from the power source is injected into at least one of the first transmitter and the second transmitter.

13. The method of claim 12, wherein the current from the power source is injected into the first transmitter and the second transmitter in sequential order.

14. The method of claim 12, wherein the current from the power source is injected into the first transmitter and the second transmitter at the same time.

15. The method of claim 11, wherein the first transmitter and the second transmitter are coupled to the production tubing positioned within the casing string.

16. The method of claim 10, wherein the magnetic induction sensor is coupled to the production tubing positioned within the casing string.

17. The method of claim 10, further comprising calculating a parameter of the formation near the wellbore based on the magnetic induction from the magnetic induction sensor.

18. The method of claim 17, wherein the parameter is at least one of a resistivity of the formation, a change in resistivity of the formation over time, an approximate location of the change in resistivity of the formation, and a fluid saturation of the formation.

19. A sensor device, comprising:
a magnetic induction coil positioned within a casing string such that a magnetic induction sensor allows a continued operation of the wellbore and a continued monitoring of a formation, the magnetic induction coil comprising a wire coiled around a magnetic core, wherein the magnetic core is a production tubing; and
an electro-optical transducer electrically coupled to the magnetic induction coil, wherein the magnetic induction coil is configured to apply an electric potential to the electro-optical transducer in response to a magnetic induction.

20. The sensor device of claim 19, wherein the electro-optical transducer is communicatively coupled to an optical interrogation system via a fiber optic cable.

21. The sensor device of claim 19, wherein the electro-optical transducer is configured to change shape in response to the electric potential on the magnetic induction coil.

22. The sensor device of claim 19, wherein the electro-optical transducer is configured to produce a light signal in response to an electric potential on the magnetic induction coil.

23. The sensor device of claim 19, wherein the magnetic induction coil and the electro-optical transducer are coupled to the production tubing positioned within the casing string.

* * * * *